(12) United States Patent
Liao

(10) Patent No.: US 8,247,821 B2
(45) Date of Patent: Aug. 21, 2012

(54) PRE-MOLDED SUPPORT MOUNT OF LEAD FRAME-TYPE FOR LED LIGHT MODULE

(75) Inventor: Mu Tsan Liao, Taichung County (TW)

(73) Assignee: Lingsen Precision Industries Ltd., T.E.P.Z. Taichung (TW)

( * ) Notice: Subject to any disclaimer, the term of this patent is extended or adjusted under 35 U.S.C. 154(b) by 212 days.

(21) Appl. No.: 12/816,589

(22) Filed: Jun. 16, 2010

(65) Prior Publication Data

US 2011/0241039 A1 Oct. 6, 2011

(30) Foreign Application Priority Data

Mar. 31, 2010 (TW) ................................ 99109961 A

(51) Int. Cl.
*H01L 27/15* (2006.01)
(52) U.S. Cl. ............................................ 257/79; 257/88
(58) Field of Classification Search ............... 257/79, 257/88
See application file for complete search history.

(56) References Cited

U.S. PATENT DOCUMENTS 4,445,132 A * 4/1984 Ichikawa et al. ................ 257/72
2007/0063321 A1 * 3/2007 Han et al. ....................... 257/675

* cited by examiner

*Primary Examiner* — Julio J Maldonado
*Assistant Examiner* — Robert Bachner
(74) *Attorney, Agent, or Firm* — Browdy and Neimark, PLLC

(57) ABSTRACT

A pre-molded support mount of lead frame-type for an LED light module includes an insulative substrate and a lead frame embodied inside the insulative substrate and provided with a positive electrical contact and a negative electrical contact, which are exposed out of the insulative substrate. A plurality of LED chips can be mounted on the pre-molded support mount and electrically connected in series or in parallel through the lead frame. The pre-molded support mount has the advantage of being capable of simplifying manufacturing process and saving manufacturing costs in production of the LED light module.

2 Claims, 5 Drawing Sheets

PRE-MOLDED SUPPORT MOUNT OF LEAD FRAME-TYPE FOR LED LIGHT MODULE

BACKGROUND OF THE INVENTION

1. Field of the Invention

The present invention relates generally to a mount for mechanically supporting and electrically connecting a plurality of light-emitting diode (hereinafter referred to as "LED") chips, and more specifically to a support mount used in an LED light module and including an insulative substrate and a lead frame embodied in the insulative substrate by pre-molding.

2. Description of the Related Art

Because of the advantages of long lifespan, small size, low heat generation and power consumption, quick response time and variety in luminant color, LED lights are intensively used nowadays in advertisement boards, traffic signals, car lights, display panels, communication equipments, and consumer electronic products. Conventionally, LED lighting units are made by the steps of spacedly mounting a plurality of LED chips in rows on a lead frame, electrically and respectively connecting the LED chips to the lead frame by bonding wires, respectively encapsulating the LED chips by epoxy resin, and cutting the lead frame into a plurality of individuals each having leads of the lead frame extending out of the encapsulant. Thereafter, one or more LED lighting units can be mechanically supported on and electrically connected with a printed circuit board (hereinafter referred to as "PCB") by soldering the exposed leads to the printed circuit board in a reflow soldering process, such that the power for lighting on the LED chips can be supplied thereto through the PCB. In order to provide sufficient luminance, a plurality of LED lighting units, eight or sixteen LED lighting units for example, may be arranged in series or in parallel on a single PCB to form an LED light module.

As indicated above, the method of making the conventional LED light module, involving the package process for encapsulating the LED chips and the surface mount technology for electrically mounting the packaged LED lighting units to the PCB, is complicated. In addition, the packaged LED light units may be damaged due to the high temperature in the reflow soldering process.

SUMMARY OF THE INVENTION

The present invention has been accomplished in view of the above-noted circumstances. It is therefore an objective of the present invention to provide a pre-molded support mount of lead frame-type for an LED light module, through which the power can be applied to the LED chips mounted on the support mount.

It is another objective of the present invention to provide a pre-molded support mount of lead frame-type for an LED light module, which can eliminate the use of a PCB and a reflow soldering process in the production of the LED light module.

To attain the above-mentioned objectives, a pre-molded support mount of lead frame-type for an LED light module is provided comprising an insulative substrate, and a lead frame for mechanically supporting and electrically connecting a plurality of LED chips. The lead frame is embodied in the insulative substrate and has exposed positive and negative electrical contacts through which the power can be supplied to the LED chips mounted on the lead frame. Since the power can be directly supplied to the LED chips through the lead frame of the support mount of the present invention, the reflow soldering process is not necessary in production of the LED light module; therefore, the damage of the LED chip due to high temperature in the reflow soldering process can be prevented. In addition, by means of the support mount of the present invention, the LED chips can be electrically connected in series and/or in parallel.

In a preferred embodiment of the present invention, the lead frame may comprise a positive pole plate having the positive electrical contact, and a negative pole plate having the negative electrical contact. The LED chips can be mechanically supported on the negative pole plate and electrically and respectively connected with the positive and negative pole plates through bonding wires.

Preferably, the pre-molded support mount may comprise conductive protrusions provided respectively at the positive and negative pole plates for electrical connection with another pre-molded support mount.

In another preferred embodiment, the lead frame may comprise a positive pole plate having the positive electrical contact, a negative pole plate having the negative electrical contact, and a common pole plate insulative to the positive and negative pole plates. The LED chips of a first set can be mechanically supported on the common pole plate and electrically and respectively connected with the common and positive pole plates through bonding wires. The LED chips of a second set can be mechanically supported on the negative plate and electrically and respectively connected with the common and negative pole plates through bonding wires.

Preferably, conductive protrusions are provided at the positive, negative and common pole plates respectively for electrical connection with another pre-molded support mount.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
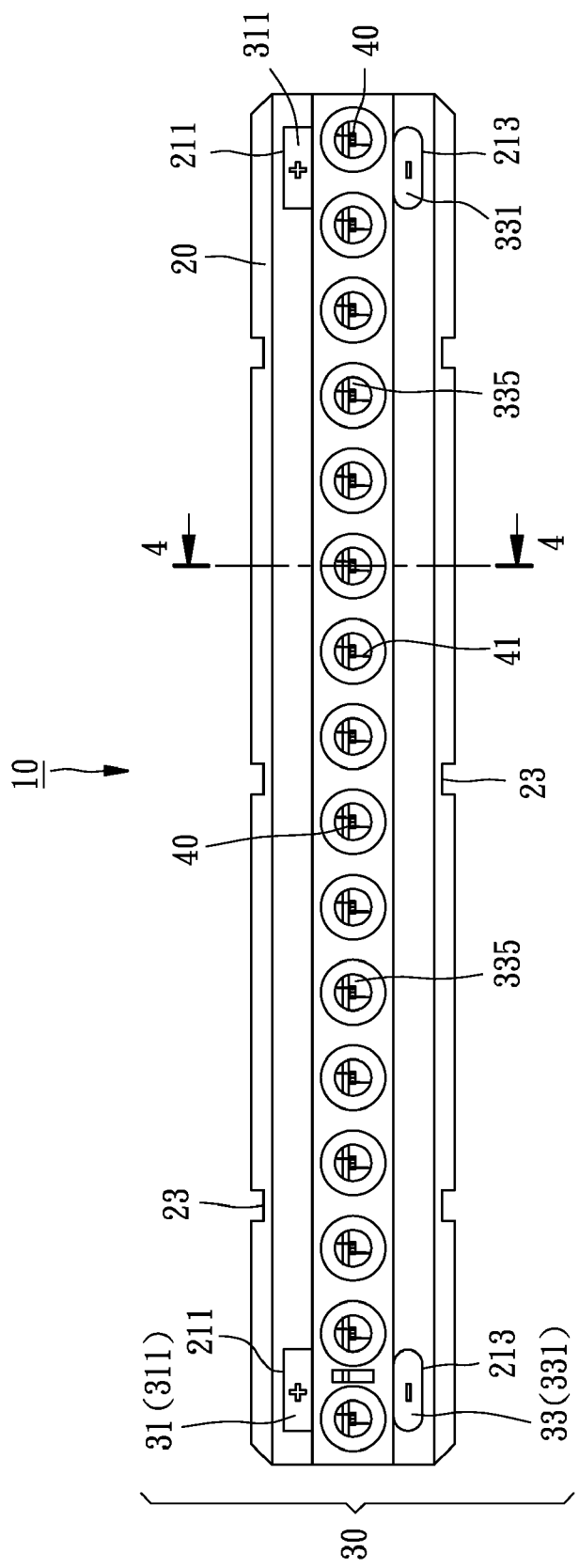
FIG. 1 is a schematic top view, showing that LED chips are mechanically supported on and electrically connected with a support mount provided in accordance with a first preferred embodiment of the present invention.

As shown in FIGS. 1-4, a support mount, denoted by a reference numeral 10, in accordance with a preferred embodiment of the present invention includes an insulative substrate 20 and a lead frame 30. On the lead frame 30, sixteen LED chips 40 are spacedly mounted, as shown in FIG. 1.

The insulative substrate 20 is made of plastics and provided at a center thereof with an elongated groove 21 extending along the longitudinal direction of the substrate 20 and having a funnel form cross-section. Through the elongated groove 21, the encapsulant, such as epoxy resin or silicon resin, can be introduced to encapsulate the LED chips. In addition, each of the two ends of the insulative substrate 20 is provided with a rectangular opening 211 and an oblong opening 213, which are arranged face-to-face at two lateral sides of the elongated groove 21. Further, the insulative substrate 20 has three notches 23 at each of the longitudinal lateral sides thereof, such that fasteners, such as screws, can be used in cooperation with the notches to fix the support mount 10 to a desired place. It will be appreciated that the material that the substrate 20 is made of is not limited to the plastics mentioned above, and the number of the notches 23 is not limited too.

Figure 2:
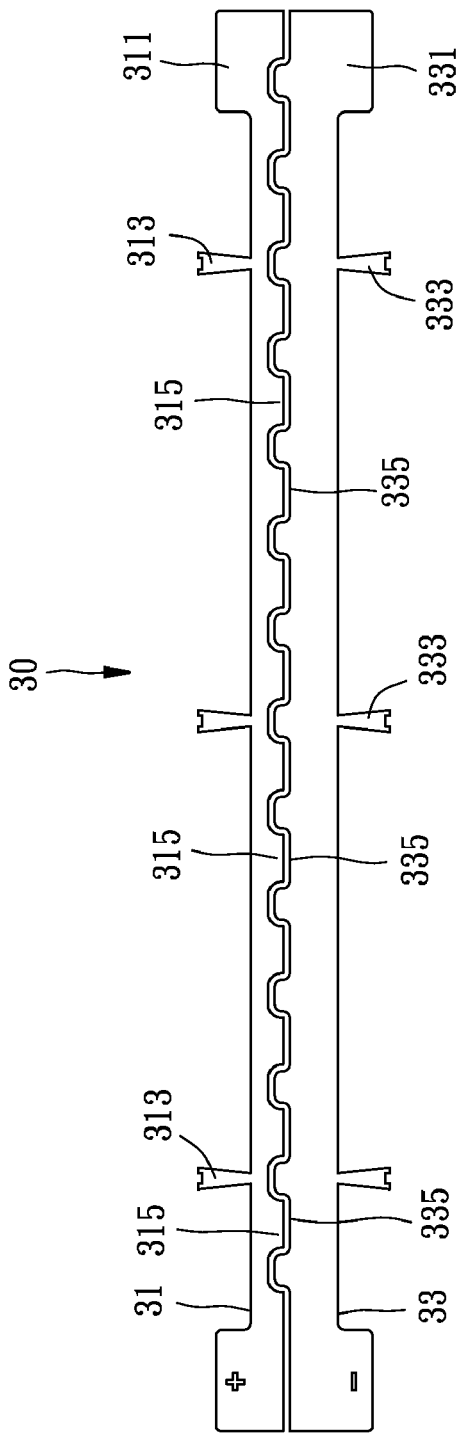
FIG. 2 is a schematic top view of the lead frame of the support mount according to the first preferred embodiment of the present invention.

The lead frame 30 is formed by stamping a metal foil, such as copper foil. As shown in FIG. 2, the lead frame 30 is divided into a positive pole plate 31 and a negative pole plate 33 spaced from the positive pole plate 31, such that the positive pole late 31 is electrically insulated from the negative pole plate 33. At each longitudinal end of the positive pole plate 31 a positive electrical contact 311 is formed and extends along a direction away from the negative pole plate 33. Similarly, a negative electrical contact 331 is formed at each of the longitudinal ends of the negative pole plate 33 and extends along a direction away from the positive pole plate 31. In addition, three first conductive protrusions 313 are spacedly provided at a longitudinal lateral side of the positive pole plate 31, and three second conductive protrusions 333 corresponding in location to the first conductive protrusions 313 respectively are provided at the longitudinal lateral side of the negative pole plate 33. As a result, two or more support mounts 10 of the present invention can be electrically connected in series by electrically connecting the first conductive protrusions 313 of the positive pole plate 31 of one support mount 10 to the second conductive protrusions 333 of the negative pole plate 33 of another support mount 10. Further, the cutting edges of the positive and negative pole plates 31 and 33 are wave-shaped and complementary in shape with respect to each other according to the shape of the cutting tool used in the stamping process in this embodiment. That is, the convex portions 315 of the positive pole plate 31 correspond respectively to the concave portions 335 of the negative pole plate 33 and vice versa.

Figure 3:
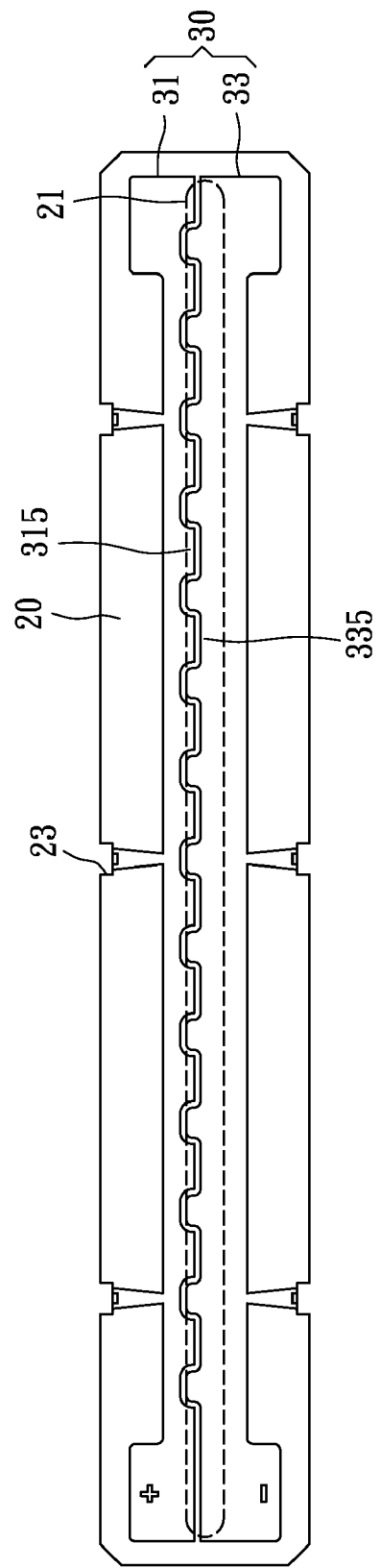
FIG. 3 is schematic top view of the support mount according to the first preferred embodiment of the present invention, in which the part of the insulative substrate that is located above the lead frame is removed for conveniently illustrative purpose.
Figure 4:
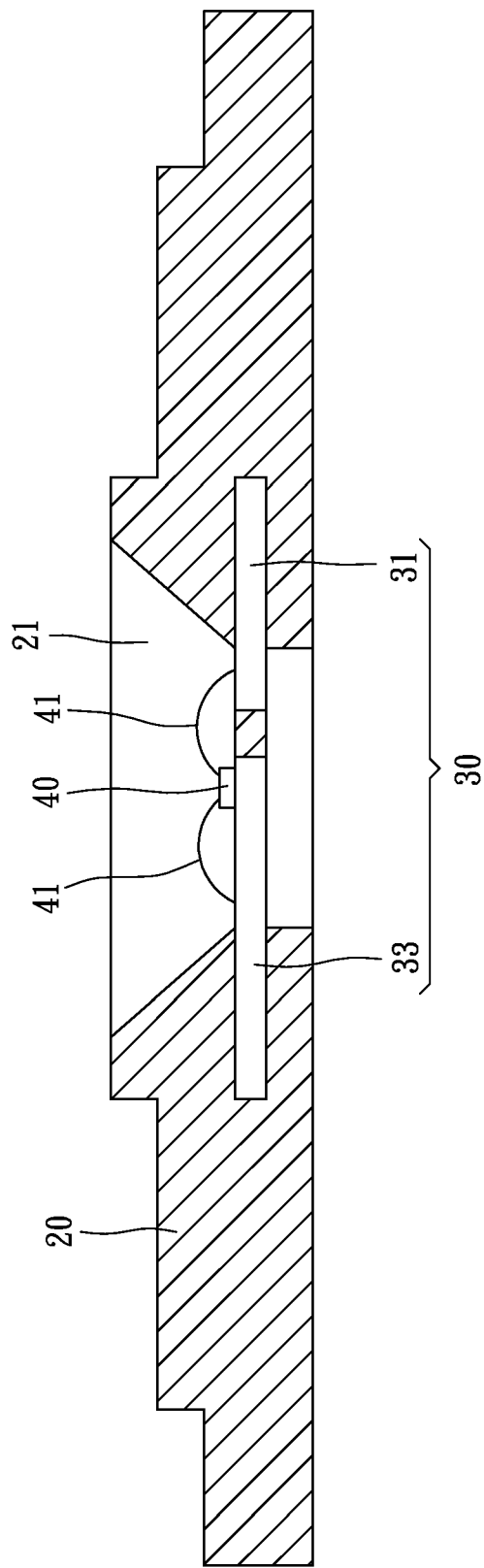
FIG. 4 is a sectional view taken along line 4-4 of FIG. 1.

By means of plastic injection molding, the lead frame 30 is embodied inside the insulative substrate 20 so as to form the support mount 10 as a unity. FIG. 3 is a top view of the support mount 10 of the present invention in which the part of the insulative substrate 20 that is located above the lead frame 30 is removed for conveniently illustrating the relationship of the lead frame 30 and the substrate 20. As shown in FIGS. 1, 3 and 4, the positive and negative pole plates 31 and 33 of the lead frame 30 are embodied inside the substrate 20 in such a way that the space defined between the positive and negative pole plates 31 and 33 is exactly located in the elongated groove 21 of the substrate 20 and the positive and negative electrical contacts 311 and 331 are exposed outside through the openings 211 and 213, such that the electricity can be applied to the positive and negative pole plates 31 and 33 of the lead frame 30 through the contacts 311 and 331.

As shown in FIGS. 1 and 4, the sixteen LED chips 40 are respectively mounted on the concave portions 335 of the negative pole plate 33 of the lead frame 30 by electrically conductive adhesive, such as silver adhesive or solder paste, and respectively and electrically connected with positive and negative pole plates 31 and 33 by bonding wires 41, such that the LED chips 40 are electrically connected in series on the lead frame 30. After the wire bonding process, the encapsulating resin, such as epoxy resin, silicon resin or other transparent resin can be introduced into the elongated groove 21 to encapsulate the LED chips 40 so as to complete the production of the LED light module.

By means of the cooperation of the notches 23 and screws (not shown in the drawings), the support mount 10 of the present invention can be fixed at any desired place. In addition, two or more support mounts 10 can be series-connected by the method mentioned above and energized by a power supply through the positive and negative electrical contacts 311 and 331 so as to facilitate the LED chips 40 to emit light.

As mentioned above, the power can be directly supplied to the support mount 10 of the present invention to light on the LED chips 40; therefore, no leads are needed for the support mount 10 of the present invention and the LED light module using the support mount 10 of the present invention needs not to be soldered on a printed circuit board by a reflow soldering process. Compared to the prior art, the support mount 10 of the present invention can prevent damage of LED chips due to high temperature in the reflow soldering process so as to simplify the manufacturing process and lower the manufacturing cost in production of the LED light module.

According to the research and test, it is found that if more than thirty-two LED chips parallel connected and mounted on the lead frame, the voltage and the current running over the LED chips will become unstable due to the long length of the lead frame. To resolve the aforesaid issue, a support mount 10' allowing series and parallel connection is provided in accordance with a second preferred embodiment of the present invention as follows.

Figure 5:
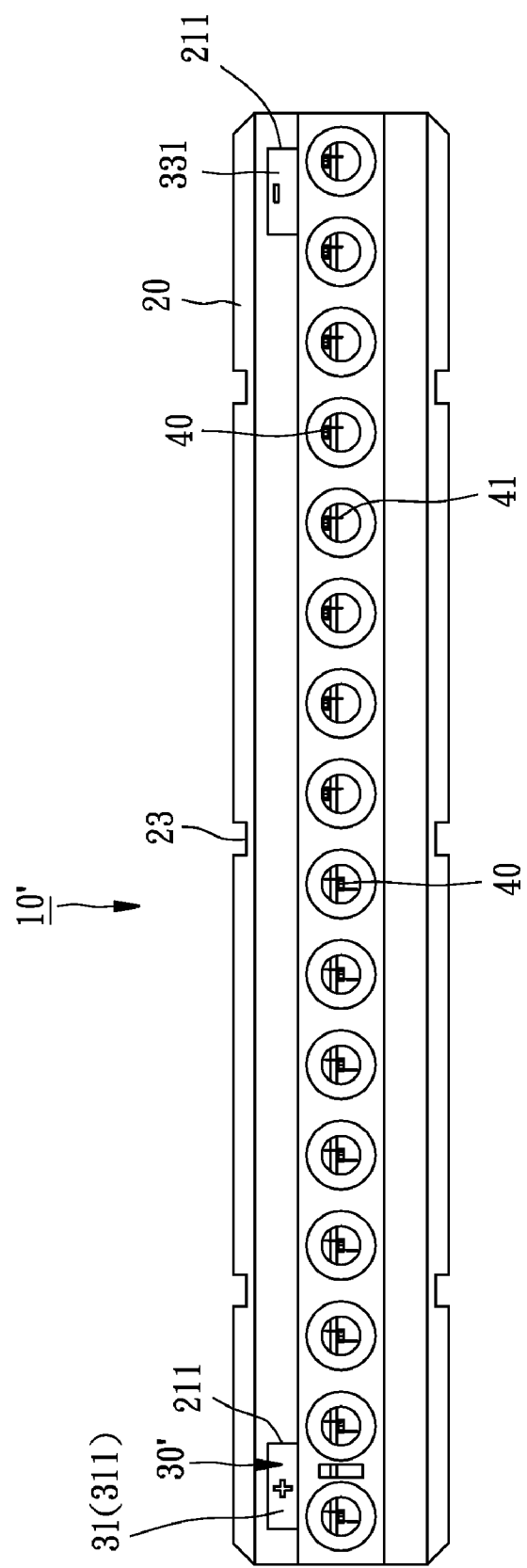
FIG. 5 is schematic top view, showing that LED chips are mechanically supported on and electrically connected with a support mount provided in accordance with a second preferred embodiment of the present invention.
Figure 6:
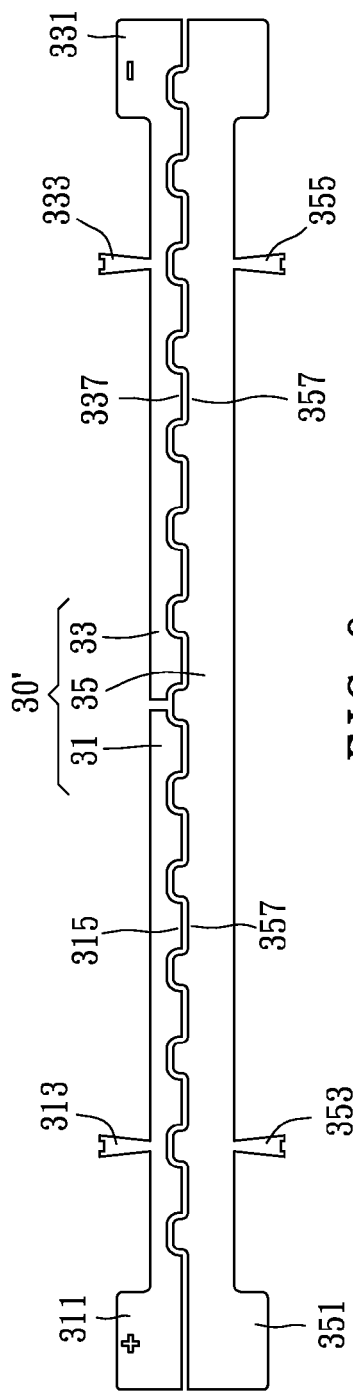
FIG. 6 a schematic top view of the lead frame of the support mount according to the second preferred embodiment of the present invention.
Figure 7:
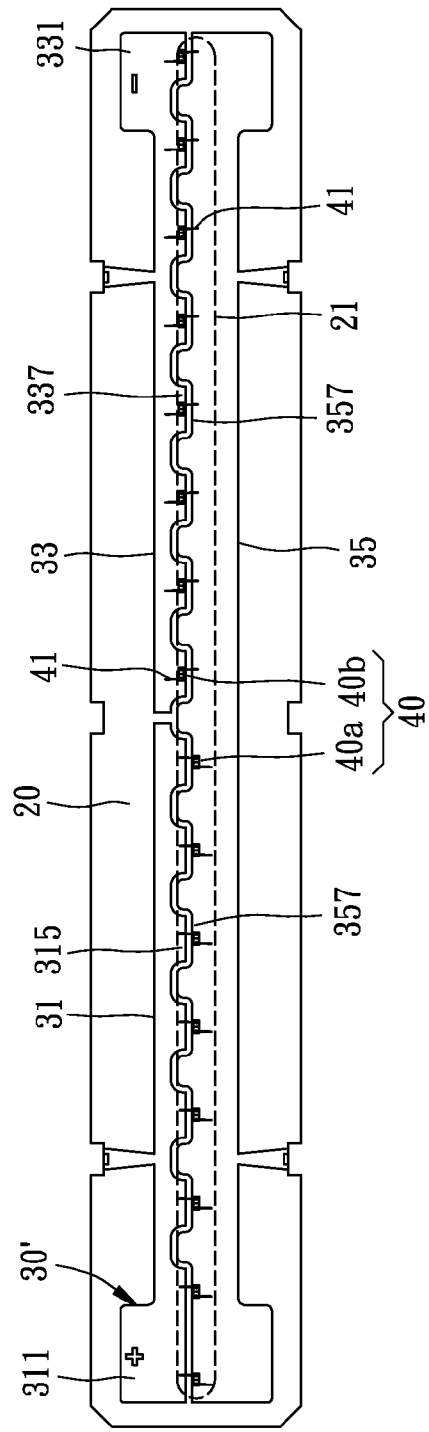
FIG. 7 is a schematic drawing showing that the LED chips are mechanically supported on and electrically connected with the lead frame of the support mount according to the second preferred embodiment of the present invention, in which the part of the insulative substrate that is located above the lead frame is removed for conveniently illustrative purpose.

As shown in FIGS. 5-7, the support mount 10' comprises an insulative substrate 20 and a lead frame 30' on which sixteen LED chips 40 are mounted. Since the insulative substrate 20 is substantially the same in structure with that of the above-mentioned first preferred embodiment, no detailed description thereof needs to be given hereinafter. Following description will be focused on the difference between the first and second preferred embodiments.

The lead frame 30' is also formed by stamping a metal foil. As shown in FIG. 6, the lead frame 30' is divided into a positive pole plate 31, a negative pole plate 33 spacedly located at a right side of the positive pole plate 31, and a common pole plate 35 parallel spaced form the positive and negative pole plates 31 and 33, such that the positive pole plate 31, the negative pole plate 33 and the common pole plate 35 are insulated from each other. At a longitudinal end of the positive pole plate 31a positive electrical contact 311 is formed and extends along a direction away from the common pole plate 35. Similarly, a negative electrical contact 331 is formed at a longitudinal end of the negative pole plate 33 and extends along the direction away from the common pole plate 35. At each of two longitudinal ends of the common pole plate 35 a common electrical contact 351 is formed and extends along a direction away from the positive or negative pole plate 31 or 33. In addition, a first conductive protrusion 313 and a second conductive protrusion 333 are respectively provided at longitudinal lateral sides of the positive and negative pole plates 31 and 33, and a third conductive protrusion 353 corresponding in location to the first conductive protrusion 313 and a fourth conductive protrusion 355 corresponding in location to the second conductive protrusion 333 are provided at a longitudinal side of the common pole plate 35. As a result, two or more support mounts 10' of the present invention can be electrically connected in series by electrically connecting the first conductive protrusion 313 of the positive pole plate 31 and the second conductive protrusion 333 of the genitive pole plate 33 of one support mount 10' to the third and fourth conductive protrusions 353 and 355 of another support mount 10' respectively. Further, the cutting edges of the positive and negative pole plates 31 and 33 and the common pole plate 35 are wave-shaped according to the shape of the cutting tool used in the stamping process in this embodiment. That is, the convex portions 315 of the positive pole plate 31 and the convex portions 337 of the negative pole plate 33 correspond respectively to the concave portions 357 of the common pole plate 35 and vice versa.

By means of plastic injection molding, the lead frame 30' is embodied inside the insulative substrate 20 to form the support mount 10' as a unity. FIG. 7 is a top view of the support mount 10' of the present invention in which the part of the substrate 20 that is located above the lead frame 30' is removed for conveniently illustrating the relationship of the lead frame 30' and the substrate 20. As shown in FIGS. 5 and 7, the positive and negative pole plates 31 and 33 and the common pole plate 35 of the lead frame 30 are embodied inside the substrate 20 in such a way that the space defined between the positive or negative pole plate 31 or 33 and the common pole plate 35 is exactly located in the elongated groove 21 of the substrate 20 and the positive and negative electrical contacts 311 and 331 are exposed outside through the openings 211, such that the electricity can be applied to the lead frame 30' through the contacts 311 and 331.

In this preferred embodiment, the sixteen LED chips 40, which are mounted on the lead frame 30' by electrically conductive adhesive, are divided into a first LED chip set 40a having eight LED chips, and a second LED chip set 40b having the other eight LED chips. As shown in FIG. 6, the chips of the first LED chip set 40a are respectively mounted on the concave portions 357 of the common pole plate 35, which correspond respectively to the convex portions 315 of the positive pole plate 31, and the chips of the second LED chip set 40b are respectively mounted on the convex portions 337 of the negative pole plate 33, which correspond respectively to the concave portions 357 of the common pole plate 35. By means of wire bonding process, the chips of the first LED chip set 40a are electrically connected with the common pole plate 35 and the positive pole plate 31 through bonding wires 41, and the chips of the second LED chip set 40b are electrically connected with the common pole plate 35 and the negative pole plate 33, such that the chips of the first LED chip set 40a are electrically connected in series together, the chips of the second LED chip set 40b are electrically connected in series together, and the first LED chip set 40a and the second LED chip set 40b are electrically connected in parallel. Finally, as described above, the encapsulating process can be carried out after the wire bonding process so as to form the LED light module.

In conclusion, the power for lighting on the LED chips can be directly supplied to the support mount of the present invention. For the support mount of the present invention, no leads are needed, such that the reflow soldering process and the use of the printed circuit board can be eliminated so as to simplify the manufacturing process and save manufacturing cost in production of the LED light module. In addition, the chips mounted on the support mount of the present invention can be series and parallel connected so as to stabilize the voltage and the current running over the LED chips. Further, two or more support mounts can be electrically connected in series conveniently.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A pre-molded support mount of lead frame-type for an LED light module, said pre-molded support mount comprising: an insulative substrate; and a lead frame for mechanically supporting and electrically connecting a plurality of LED chips, the lead frame being embodied in the insulative substrate and having exposed positive and negative electrical contacts, wherein the lead frame comprises: a positive pole plate having said positive electrical contact; a negative pole plate having said negative electrical contact and being insulative to the positive pole plate; and a common pole plate insulative to the positive and negative pole plates; wherein the LED chips comprise a first LED chip set for mounting on the common pole plate and electrically connecting the positive and common pole plates, and a second LED chip set for mounting on the negative pole plate and electrically connecting the common and negative pole plates.

2. The pre-molded support mount as claimed in claim 1, wherein the positive pole plate comprises a first conductive protrusion, the negative pole plate comprises a second conductive protrusion, and the common pole plate comprises third and forth conductive protrusions; wherein two of the pre-molded support mounts are electrically connected in series in a way that the first conductive protrusion of the positive pole plate of one of said pre-molded support mounts is electrically connected with the third conductive protrusion of the common pole plate of the another pre-molded support mount, and the second conductive protrusion of the negative pole plate of the one of said pre-molded support mounts is electrically connected with the forth conductive protrusion of the common plate of the another pre-molded support mount.

* * * * *